CIRCUIT ASSEMBLY

Filed Dec. 30, 1957

INVENTORS
EDWIN R. WYMA
WARREN H. KLIPPEL
FRED K. BUELOW

BY

J W Armbruster
ATTORNEY

3,013,187
CIRCUIT ASSEMBLY

Edwin R. Wyma and Warren H. Klippel, Poughkeepsie, and Fred K. Buelow, Wappingers Falls, N.Y., assignors to International Business Machines Corporation, New York, N.Y., a corporation of New York Filed Dec. 30, 1957, Ser. No. 706,180
1 Claim. (Cl. 317—101)

This invention relates to an improved method of connecting a circuit package to hold together a set of electronic components. A plurality of component holding boards are tied together by nested terminals arranged along two outer edges and connected by wire wrap connections.

The device relates to a series of panels or insulation boards in a decked formation with the several boards assembled one above the other and with electronic components on and between certain of the boards. Arranged along two opposite outer edges of the upper boards are stamped terminals fastened to the boards, said terminals extending upwardly and evenly spaced with room between them for wire wrapping tools. The different boards and the terminals thereon are arranged in a nested formation wherein the smaller second board has terminals fitting within the confines of the terminals on the first board and the third board to be assembled is still smaller and has extending terminals fitting within the confines of the other two sets of terminals. As a result of such nesting, the circuit assembly presents two rows of assemblies of three terminals extending upwardly side by side with the inner terminal slightly shorter and lower than the two outer terminals. Thus the terminal groups are ready to be connected by solderless wire wrap connections. Because of the stepped formation of the terminals, the wire wrap connection is shouldered because the lower part of the wrap is around three terminals while the upper part encircles only two terminals. This shouldered wrap therefore not only serves to connect the terminals but also serves to hold the upper panel board down over the other spaced boards.

The natural shape of the stampings with the sharp edges on one side is used advantageously by facing the sharp edges of the pairs and triplet arrangement of terminals so that the sharp edges face outwardly to make biting connections with the wrapping wire on both shoulders.

The outer terminal stems extend not only upwardly above the top panel board but also downwardly through and below the main lower board. Various components may be connected by wrapping their leads around the terminal stampings between the boards or on either side of upper and lower boards. In some instances, the leads may be assembled under the portions of the stampings where they are formed with extensions grasping through perforations in the boards and the leads may be soldered or welded to various lugs or platforms on the terminals. The whole structure dispenses with the use of printed circuits because the package is so compact that the leads of the various components go directly to the terminal stems rather than through any interposing printed wiring. The long outer terminals have connections in three or more positions, i.e., at the bottom for logical circuit input or output connections, intermediate for static component connections, and at the top for transistor or other active component and general terminal wiring connections.

From the foregoing it is apparent that the main object of the invention is to provide a sturdy and compact circuit assembly containing a plurality of separate but related electrical devices.

Another object of the invention is the provision of a modular circuit package involving the use of regularly spaced stamped terminals arranged along the edges of a plurality of holding boards.

Another object of the invention is the provision of an improved circuit package involving the nested arrangement of circuit boards of graduated sizes having terminals arranged to be grouped along the edges of the assembly when it is brought together for connection.

Another object of the invention is the provision of a circuit assembly involving a plurality of component carrying boards arranged in a decked formation and having a plurality of its sides provided with regularly spaced stamped terminals fitted side by side to receive common wire wrap connections. The important feature of the decked formation is the separation of the active and passive components of an electronic circuit. Although the illustration involves the assembly of a transistor and its related devices it is apparent that other formations of tubes, semiconductors, cores, etc., may be handled advantageously in the same fashion.

Another object of the invention is the provision of a circuit assembly involving the nesting of terminals of different height whereby the placing of a wire wrap connection thereon causes the wrapping connection to assume a shouldered contour and serve to hold the terminal axially as well as side by side.

Another object of the invention is the provision of a plurality of exterior connections in a circuit assembly which makes them accessible for easy sequential disconnection and removal of components.

Other objects of the invention will be pointed out in the following description and claim and illustrated in the accompanying drawings, which disclose, by way of example, the principle of the invention and the best mode, which has been contemplated, of applying that principle.

In the drawings:

FIGURE 1 is a general perspective view showing an entire assembly of three boards in a decked and nested formation. The transistors are shown on the top board with leads soldered or welded to the inner terminals. Static components are connected between the lower two boards. Other wrap or solder connections may be made to the lower ends of the long outer terminals below the bottom board.

Figures 1, 2, 3, 4, 5:
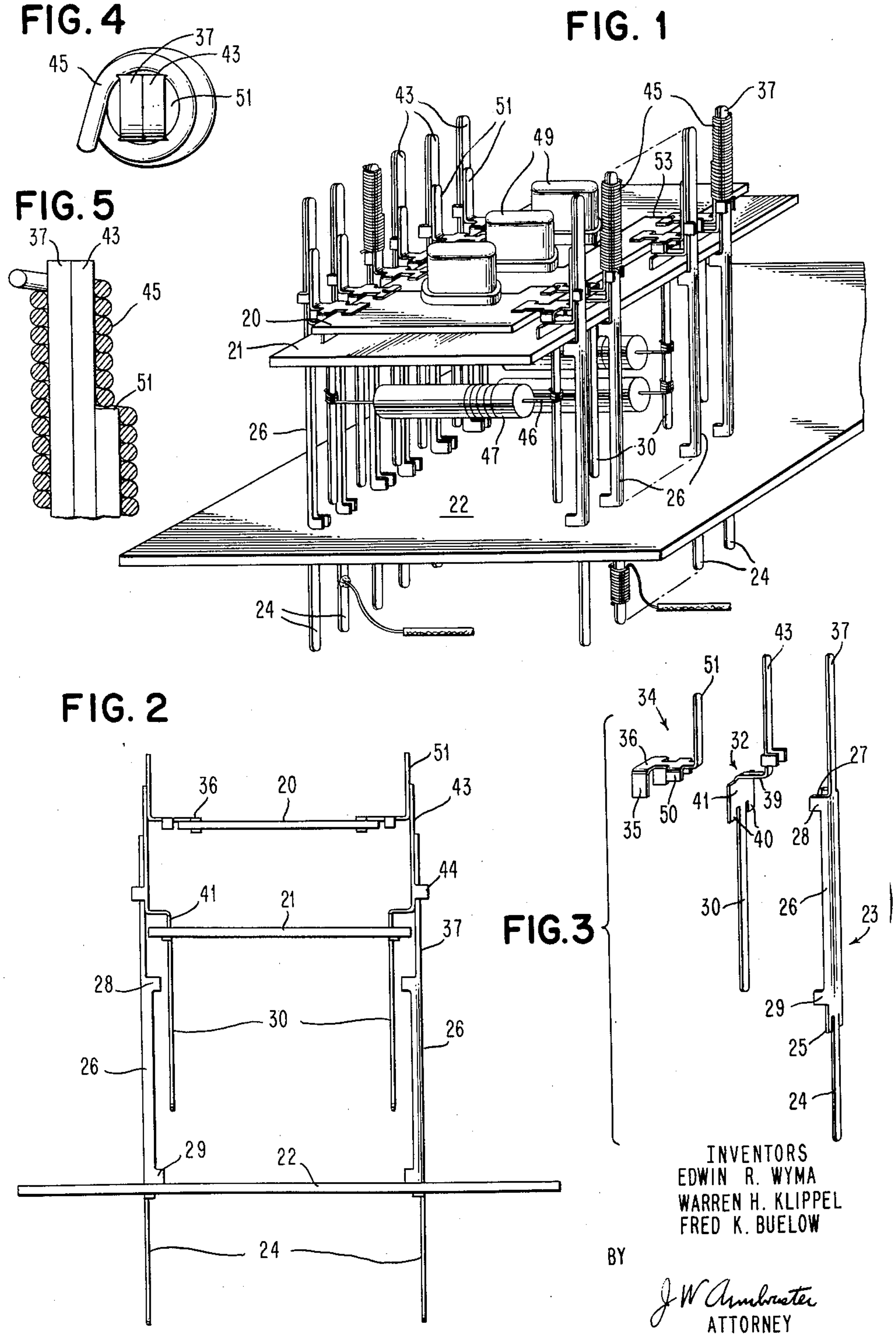
FIGURE 2 is an exploded front elevation view showing the three boards separated and raised vertically with respect to each other to reveal the contours of the terminals.
FIGURE 3 is a composite but exploded elevation view of the three terminals separated horizontally to show the ledges, bends, platforms and lugs thereon.
FIGURE 4 is a plan view of a wire wrap connection showing the three terminals held within the wrapping wire with the sharp stamped edges facing outwardly to bite into the wrapping wire.
FIGURE 5 is an elevation view of a wire wrap connection showing the shouldered contour which results from wrapping around a stepped formation of grouped terminal ends at different levels.

The exploded view in FIG. 2 shows three boards 20, 21 and 22 moved apart vertically from the nested positions as in the FIG. 1 perspective where they appear as normally assembled. The perspective illustrates that the boards are of graduated sizes and the large lower board 22 has two sets of long terminals 23 which have a part to part spacing which is of a modular value (say .200 or .250 of an inch and wide enough for room for wire wrap tools). The "across the board" or set to set spacing of terminals 23 is also carefully selected, not only to conform to a modular arrangement but also to conform with the nesting procedure with regard to the upper terminals and the width of boards 20 and 21.

Regarding the specific formation of long terminals 23, in FIG. 3, it is noted that each such terminal has a lower stem 24 extending below board 22 for receiving either soldered or wire wrapped logical wiring connections. These are easily accessible for changes or removal of wires and form a desirable feature of the novel package. A double clamp or lug formations 25 on terminal 23 fastens it to the board 22 in an erect position perpendicular to the surface of the board. Stem 24 and lugs 25 are extended downwardly through a slot in board 22 before the lugs are bent to clamp to the board. Above the board, terminal 23 is shaped with a U-shaped cross section portion 26 and a shoulder 27 which forms one of a series of ledges upon which the second board 21 rests in the final decked arrangement. The U-shaped portion 26 has four extensions in pairs at 28 and 29 which act as confining or embracing members for the lower end 30 of the second terminal 32. The upper part 33 of terminal 23 is high enough to project above the highest board 20 and so be alongside the terminals 34 thereof which are of equal spacing but preferably of thinner stock so that the formed clamps 35, which fasten the thin stamped terminal 34 near the edge of board 20, provides a metallic platform 36 to which solder connections of leads of transistors or other active components may be connected where they are accessible.

Returning to consideration of the long terminal 23 it will be noted that its top end 37 is rounded for easy access of wire wrap or other tools and it is faced with its sharp burr edge facing outwardly i.e. away from the inner terminals 32 and 34 which have their sharp edges facing oppositely. These sharp edges are the natural result of punch press operation where the punch side of the blank has no rounded edge but a rather sharp corner which is an excellent shape for receiving, biting into, and holding a tight wire wrap connection.

In FIG. 3 it is seen that the center terminal 32 is of a stepped form with an offset portion 39 which is poised above the board 21 when the lower end is inserted, projected or forced through the board to the extent that the pair of clamping lugs 40 extend below the board and the pair of wings 41 rest on the top of the board and prevent further descent. Of course, for fastening purposes the lugs 40 are bent up against the underside of board 21.

The upper end 43 of each terminal 32 is long enough to be alongside the end 37 of the adjacent terminal 23 for the full height and similarly shaped with a rounded end. Part way up, terminal 32 is formed with a pair of ears 44 which are spaced apart to confine end 37 and also act as a catch for the lower loose end wire of a wire wrap connection such as the connection 45 shown in FIG. 1. As already noted, stamped end 43 (FIG. 3) has its sharp edges facing to the left and end 37 has its sharp edges facing to the right so that when the two are wire wrapped by connection 45, FIGS. 4 and 5, the outer edges bite into the wrap wire.

In the assembly view FIG. 1, it is seen that when a pair of terminals 32 are mounted on the sides of the board 21, the span between them is so narrow that the usual lead wires 46 of a resistance, condenser, inductance or other component 47 are long enough to extend from terminal to terminal and avoid the use of any intermediary such as the usual printed circuit, bus bar or separate soldered wire. Thus the package is one of short lines and separated, shielded elements with rugged connections of low resistance.

FIGS. 1 and 2 also illustrate the nesting and decked relationship between the assemblies of boards 21 and 22. Both assemblies when viewed from the front are of a general H-shaped outline with the upper H assembly of board 21 fitting within the two top arms of the larger H assembly of board 22. The two rows or sets of long terminals 23 are spaced apart a slightly greater distance than the separation of sets of terminal 32 on board 21 and consequently a component carrying board 21 may be brought into register with pairs of lugs 44 embracing all related stems 37 and lowered to rest on shoulders 27 and ready for reception of the third or smallest board 20 which carries one or more transistors 49 as shown in FIG. 1.

Along the two sides of board 20 there are the sets of short terminals 34, FIG. 3, which have the same part to part spacing as the other sets of terminals 23 and 32, but the sets of terminals 34 have a narrower spacing so as to fit within or nest between the upper parts 43 of the terminals of the second board 21. The assembly of board 20 is essentially U-shaped and this U fits within the upper part of the smaller H contour of the second board which in turn fits within the upper part of the larger H contour of the main board 22.

Terminals 34, FIG. 3 are essentially L-shaped and have a horizontal platform 36 to which leads may be soldered or welded. Extending downwardly from this platform 36 are the fastening lugs 35 which extend through board 20 and are bent to clamp thereon. Part way back on platform 36 there is formed a pair of downwardly facing lugs 50 which are spaced to embrace the step 39 of the other terminal 32.

The upper end 51 of each terminal 34 is shorter than the corresponding portions 37 and 43 of the other two terminals. This end 51 is faced with its sharp edges to the left, FIG. 3, to complement the oppositely facing sharp edges of end 37 and form a good wire wrap foundation. Since end 51 is shorter there is a stepped formation of the ends 37, 43 and 51 and this is also reflected in the step 52 found in the final wire wrap connection, FIG. 5. Thus the wrap connection 45 not only brings the three terminals into a tight electrical joint, but it also provides the shouldered wrap which prevents axial movement and serves to hold the upper board 20 down in position as spaced slightly above the board 21 by cooperation between the lugs 50 and the wings 41.

Small holes in the top board 20 provide entry for the leads of the transistor to be threaded under the board in the space provided by wings 41 of the second terminals 32. These transistor leads may be either under or on top of the board 20 or both and connected to the terminals in any fashion by clamping, wrapping, soldering, welding or any good electrical fastening.

FIG. 4 illustrates how the sharp outer edges of the upper terminal ends bite into the wire wrap 45 and provide an excellent electrical connection. In FIG. 1 it is apparent that selected ones of the groups of terminal stems may be connected by a wire wrap or all terminals may be connected for complicated circuitry. With the upper transistor board so accessible it is easy to unwrap and remove the top board when so required. Of course the underside of the bottom board is also easily reached for either changing, unwrapping or removal of soldered cable connections.

Assembly FIG. 1 shows that the entire package is a compact device of current switching circuits comprising three separate units which are joined into a single device by means of wire wrapping. Each unit comprises an unclad rectangular phenolic board with two rows of vertical terminals along opposite edges. The required resistors etc. 47 are wire wrapped or soldered under the middle board 21 before final assembly. These component leads 46 may be attached to a terminal directly across from the first terminal attachment or it may be offset as many as three positions in either direction. As many as five leads may be secured to a single terminal end. The leads are wire wrapped and then soldered. In some instances a sheet lace work of copper foil or other metal may be fixed on the top of the top board 20 to aid in radiating and extending the transistor leads 53 which may be welded to the lace-work as well as to the nearest terminals.

A pluggable cable connector may be fastened to the bottom board 22 as a convenient means for bringing changeable cable wiring into and out of the unit and for quick assembly and removal of units.

It is to be understood that the bottom board 22 may be of a size to hold only one or dozens of the smaller top assemblies. By merely prearranging sets of paired rows of slots in a large board 22, it is ready for quick insertion of the subassemblies of boards 20 and 21 and cable connections on the bottom. Modular spacings all around render the units and assemblies receptive to automatic assembly operations.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claim.

What is claimed is:

A circuit board component assembly comprising a plurality of boards in a decked formation, two sets of long terminals arranged along opposite edges of one board and projecting above the level of the next higher board, two sets of stamped terminals on said higher board, said stamped terminals projecting upward next to mating terminals of said long terminal sets, said stamped terminals being formed with an offset portion with tabs engaging the higher board, said offset portion providing a metallic platform for a solder connection to a component on the higher board, and a connection between certain of the related pairs of upper parts of the long and stamped terminals.

References Cited in the file of this patent

UNITED STATES PATENTS

| | | |
|---|---|---|
| 2,028,717 | Hayden | Jan. 21, 1936 |
| 2,196,147 | Dunn | Apr. 2, 1940 |
| 2,759,166 | Mallian | Aug. 14, 1956 |
| 2,774,014 | Henry | Dec. 11, 1956 |
| 2,872,624 | Belek | Feb. 3, 1959 |
| 2,885,602 | Emerson | May 5, 1959 |
| 2,909,710 | Platt | Oct. 20, 1959 |
| 2,913,634 | Scoville | Nov. 17, 1959 |

FOREIGN PATENTS

| | | |
|---|---|---|
| 592,686 | Great Britain | Sept. 25, 1947 |
| 159,232 | Australia | Oct. 7, 1954 |
| 753,605 | Great Britain | July 25, 1956 |